US011803671B2

(12) United States Patent
Bellows et al.

(10) Patent No.: US 11,803,671 B2
(45) Date of Patent: Oct. 31, 2023

(54) SYSTEMS AND METHODS FOR AUTOMATICALLY GENERATING SENSOR LAYOUTS

(71) Applicant: ZEBRA TECHNOLOGIES CORPORATION, Lincolnshire, IL (US)

(72) Inventors: David Bellows, Old Westbury, NY (US); Aslam Mohammed, Glen Ellyn, IL (US)

(73) Assignee: Zebra Technologies Corporation, Lincolnshire, IL (US)

( * ) Notice: Subject to any disclaimer, the term of this patent is extended or adjusted under 35 U.S.C. 154(b) by 504 days.

(21) Appl. No.: 16/995,998

(22) Filed: Aug. 18, 2020

(65) Prior Publication Data
US 2022/0058299 A1 Feb. 24, 2022

(51) Int. Cl.
*G06F 30/13* (2020.01)
*G01D 21/00* (2006.01)
*H04L 67/12* (2022.01)

(52) U.S. Cl.
CPC .............. *G06F 30/13* (2020.01); *G01D 21/00* (2013.01); *H04L 67/12* (2013.01)

(58) Field of Classification Search
CPC ......... G06F 30/00; G06F 30/13; G01D 21/00; H04L 67/12; G06Q 10/08; G06K 19/0723
USPC ............................................................ 703/1
See application file for complete search history.

(56) References Cited

U.S. PATENT DOCUMENTS

| 2012/0296610 | A1* | 11/2012 | Hailemariam | G06T 19/00 703/1 |
| 2013/0030770 | A1 | 1/2013 | Scrafford et al. | |
| 2018/0121571 | A1* | 5/2018 | Tiwari | G06F 30/13 |
| 2021/0182921 | A1* | 6/2021 | Onkels | G06Q 30/0633 |

FOREIGN PATENT DOCUMENTS

| EP | 2797016 A2 | 10/2014 | |
| EP | 2919503 A1 * | 9/2015 | H04L 41/22 |
| EP | 2919503 A1 | 9/2015 | |
| WO | 20160154312 A1 | 9/2016 | |

OTHER PUBLICATIONS

Bianco, Simone et al., "Sensor Placement Optimization in Buildings", 2012, Image Processing Machine Vision Applications V, SPIE. (Year: 2012).*
Combined Search and Examination Report for Great Britain Patent Application No. 2110795.8 dated Sep. 29, 2022.
Examination Report for Great Britain Application No. 2110795.8 dated May 11, 2023.

* cited by examiner

Primary Examiner — Cedric Johnson

(57) ABSTRACT

A computing device includes: a memory storing sensor placement rules; a processor connected with the memory, the processor configured to: obtain a floor plan representing a facility, the floor plan including contextual data representing spatial and structural features of the facility; define, based on the contextual data of the floor plan, one or more sensor placement regions within the facility; for each sensor placement region: generate a sensor layout within the sensor placement region based on the sensor placement rules; generate, based on a correspondence between the sensor placement region and the floor plan, a list of sensor devices and corresponding coordinates for each sensor device; and output the list of sensor devices and the corresponding coordinates.

20 Claims, 8 Drawing Sheets

SYSTEMS AND METHODS FOR AUTOMATICALLY GENERATING SENSOR LAYOUTS

BACKGROUND

Facilities, such as retail facilities and warehouses, may include sensors placed about the facility to detect and track activity at the facility. Sensor layouts may be generated by individually placing each sensor, which may be a time-consuming and error-prone process.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
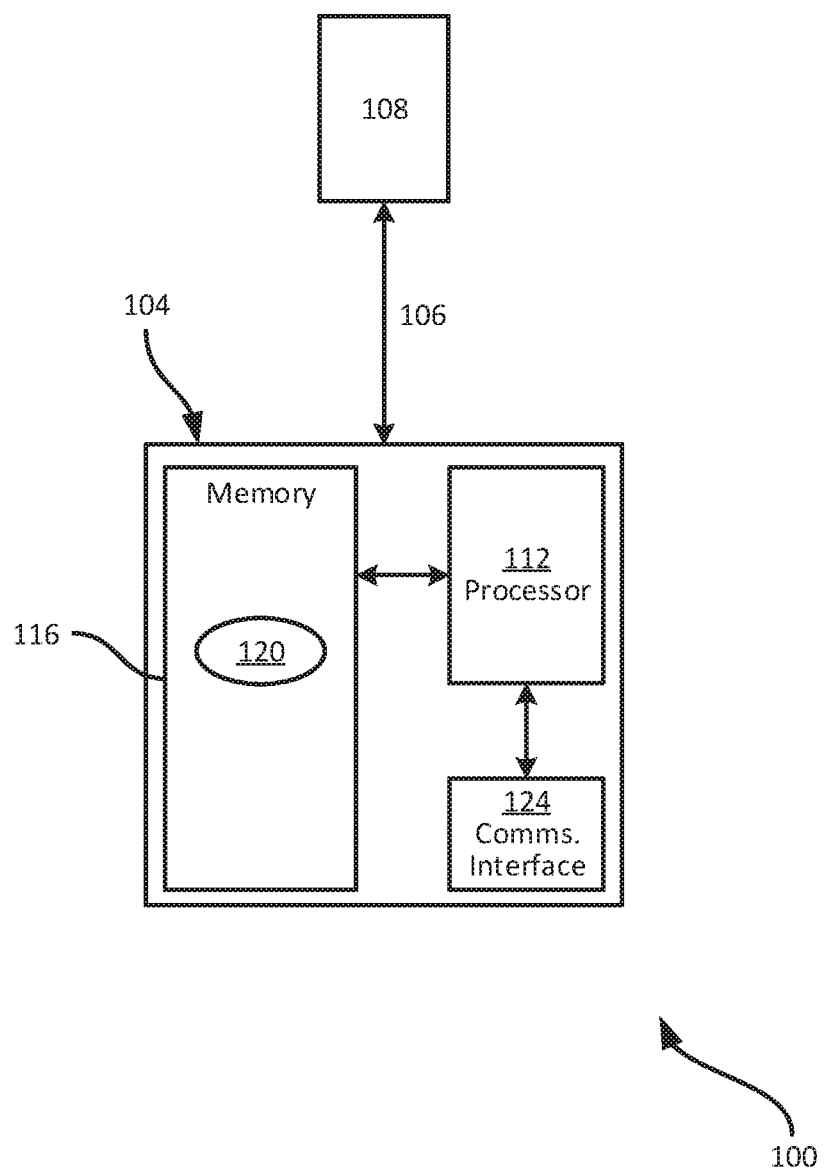
FIG. 1 is a schematic of a system for automatically generating sensor layouts.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Generating sensor layouts for facilities is an error-prone, time-consuming process. Traditional layout tools place each sensor device individually, and evaluate, for each device, where on a map or floor plan to place the sensor device. The individual treatment of sensors or other devices may be particularly time-consuming and inefficient, especially in large facilities where hundreds or thousands of sensors are to be laid out. Additionally, the individual treatment of sensors may not consider placement of future devices in a first iteration, and hence may require many iterations to adjust and shift each sensor. That is, the individual treatment of sensors focuses on an optimal position for the sensor being placed, and does not consider the geometry of the space as a whole, and other sensors with which the sensor cooperates and interacts. Accordingly, beyond the time and computation for each individual sensor, such a method may require further iterations to account for basic coverage specifications and other rules. Further, such methods may result in the addition of additional sensors to meet coverage specifications, resulting in higher hardware and installation costs. If the layout were automated and optimized, these unnecessary additional sensors may be avoided.

Examples disclosed herein are directed to a computing device comprising: a memory storing sensor placement rules; a processor connected with the memory, the processor configured to: obtain a floor plan representing a facility, the floor plan including contextual data representing spatial and structural features of the facility; define, based on the contextual data of the floor plan, one or more sensor placement regions within the facility; for each sensor placement region: generate a sensor layout within the sensor placement region based on the sensor placement rules; generate, based on a correspondence between the sensor placement region and the floor plan, a list of sensor devices and corresponding coordinates for each sensor device; and output the list of sensor devices and the corresponding coordinates.

Additional examples disclosed herein are directed to a method comprising: storing, at a memory, sensor placement rules; obtaining a floor plan representing a facility, the floor plan including contextual data representing spatial and structural features of the facility; defining, based on the contextual data of the floor plan, one or more sensor placement regions within the facility; for each sensor placement region: generating a sensor layout within the sensor placement region based on the sensor placement rules; generating, based on a correspondence between the sensor placement region and the floor plan, a list of sensor devices and corresponding coordinates for each sensor device; and outputting the list of sensor devices and the corresponding coordinates.

FIG. 1 depicts a system 100 for automatically generating sensor layouts. The system 100 may be deployed to automatically generate sensor layouts for a facility, such as a retail establishment, warehouse, or other transport and logistics-related facility. The system 100 includes a server 104. The server 104 may be in communication with a client device 108 via a communication link 106.

The server 104 is generally configured to automatically and efficiently generate sensor layouts by considering sensor placement rules in view of the geometry of the space, the interactions between sensors, and other spatial and structural features (e.g., obstructions, fixtures in the space, and the like) of the facility. The server 104 applies sensor placement rules, including, for example selecting and applying a predefined layout plan and modifying sensor placements within threshold tolerances of the predefined layout plan, to a sensor placement region to generate a sensor layout. The sensor layout may then be converted into a list of sensor devices and corresponding coordinates, including sensor labels configured to create a natural and efficient walking path from sensor to sensor in a sequentially labelled order through the facility.

The server 104 includes a processor 112 interconnected with a non-transitory computer-readable storage medium, such as a memory 116. The memory 116 includes a combination of volatile memory (e.g. Random Access Memory or RAM) and non-volatile memory (e.g. read only memory or ROM, Electrically Erasable Programmable Read Only Memory or EEPROM, flash memory). The processor 112 and the memory 116 may each comprise one or more integrated circuits. The memory 116 stores computer-readable instructions for execution by the processor 112. In particular, the memory 116 stores a sensor layout generation application 120 which, when executed by the processor 112, configures the processor 112 to perform various functions discussed below in greater detail and related to the sensor layout generation by the server 104. The application 120 may also be implemented as a suite of distinct applications.

Those skilled in the art will appreciate that functionality implemented by the processor 112 may also be implemented by one or more specially designed hardware and firmware components, such as a field-programmable gate array (FPGA), application-specific integrated circuit (ASIC), and the like in other implementations. In an implementation, the processor 112 may be a special purpose processor which may be implemented via dedicated logic circuitry of an ASIC, an FPGA, or the like in order to enhance the processing speed of the sensor layout generation discussed herein.

The memory 116 also stores rules and data for the sensor layout generation. For example, the memory 116 may store sensor placement rules for various sensor types, predefined sensor layout plans, threshold tolerances for adjusting the sensors within the predefined sensor layout plans, and the like. The memory 116 may also store the generated sensor layouts and/or the lists of sensor devices and corresponding coordinates for further processing.

The server 104 further includes a communications interface 124 interconnected with the processor 112. The communications interface 124 includes suitable hardware (e.g., transmitters, receivers, network interface controllers and the like) allowing the server 104 to communicate with other computing devices, such as the client device 108, via the communication link 106. The specific components of the communications interface 124 are selected based on the type of network or other links that the server 104 communicates over. The link 106 may include wired or wireless connections, including suitable wide area networks (WAN), including cellular networks and the Internet. The communication link 106 may further utilize local area networks defined by one or more routers, switches, wireless access points, combinations of the above, or the like. The server 104 may be configured, for example, to communicate with the client device 108 to receive requests for sensor layouts and to communicate a resulting list of sensor devices and coordinates for the sensor devices.

The processor 112 may also be connected to one or more input and/or output devices (not shown). The input and/or output devices can include one or more keyboards, mice, display screens, touch screens, microphones, speakers, barcode readers, or the like for receiving input or providing output to/from an operator of the server 104.

The client device 108 may be a computing device, such as a desktop computer, laptop computer, mobile device, tablet, kiosk, other server, or other suitable computing device. In particular, the client device 108 is configured to communicate with the server 104 via the communication link 106 to request sensor layouts and receive a resulting list of sensor devices and coordinates for the sensor devices. The client devices 108 therefore include suitable hardware (e.g., including communications interfaces, processors, memories, user interfaces, and the like) to enable the functionality described herein. In some examples, rather than requesting a sensor layout from the server 104, the client device 108 may execute an application stored in a memory at the client device 108, to generate a sensor layout including providing a list of sensor devices and corresponding coordinates.

Figure 2:
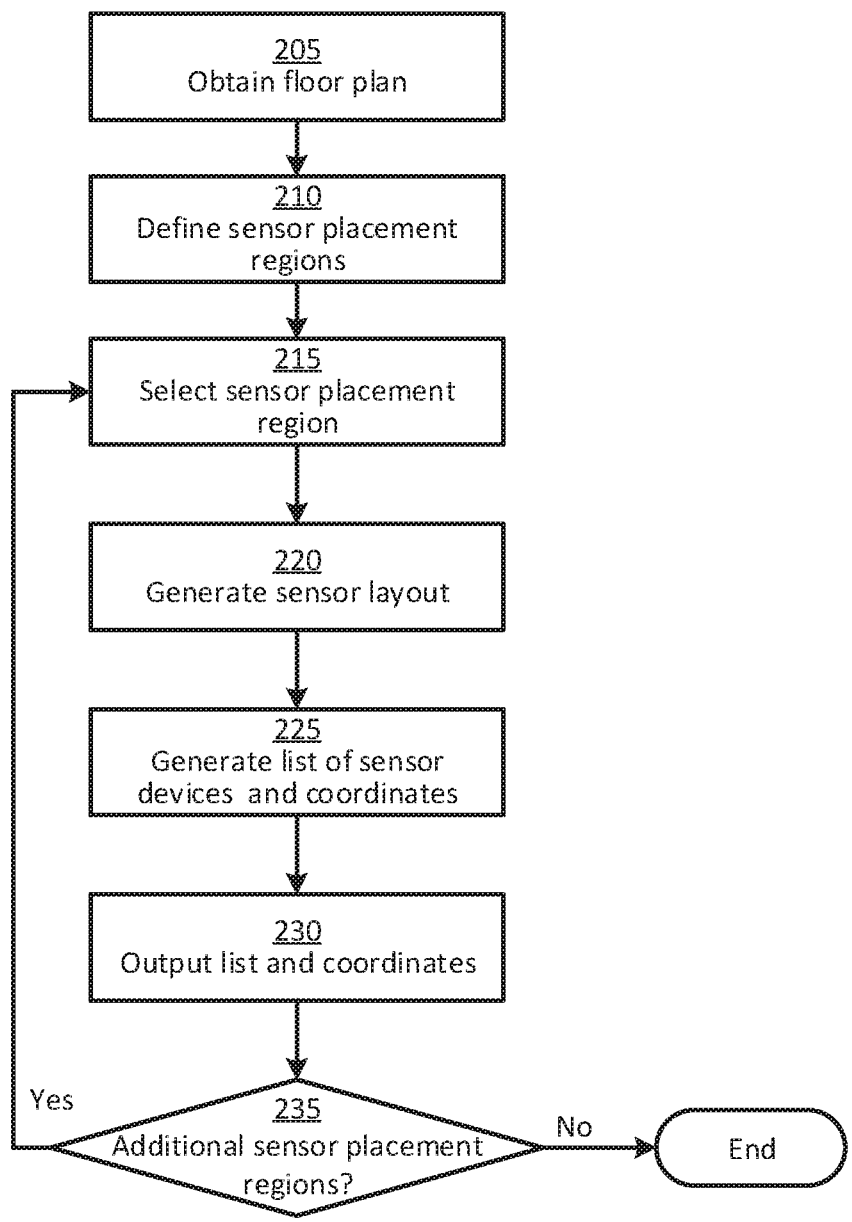
FIG. 2 is a flowchart of a method of automatically generating sensor layouts.

Turning now to FIG. 2, the functionality implemented by the server 104 will be discussed in greater detail. FIG. 2 illustrates a method 200 of automatically generating a sensor layout. The method 200 will be discussed in conjunction with its performance in the system 100, and particularly by the server 104, via execution of the application 120. In particular, the method 200 will be described with reference to the components of FIG. 1. In other example implementations, the method 200 may be performed locally at the client device 108, or by other suitable computing devices.

The method 200 is initiated at block 205, for example, in response to receiving, at the server 104, a sensor layout request from the client device 108. At block 205, the server 104 obtains a floor plan or a map representing a facility in which to lay out sensors for deployment. For example, the sensor layout request received from the client device 108 may include a floor plan for which the server 104 is to generate a sensor layout. In other examples, the server 104 may retrieve the floor plan stored in the memory 116. As used herein, the term "floor plan" is not to be limited to features laid out on the floor of the facility, and may include maps or plans including one or more layers including plans for different relevant aspects of the facility (e.g., lighting, electric, HVAC, architectural and structural elements, and the like).

The floor plan generally represents the layout of walls and rooms in the facility. The floor plan may further include contextual data defining spatial features, internal structural features, and various further aspects of the facility. For example, the contextual data may define region types for each room and/or region in the facility. In a retail facility, room types may include a sales floor, a back room/stock room (e.g., for receiving deliveries and/or storing overstocked merchandise), fitting rooms, sensor-less regions (e.g., bathrooms), and the like. Regions may include point of sale areas, merchandise return areas, order pickup areas, and the like. The contextual data may also define coordinates for various spatial features of the facility, including, for example, a front door and/or other entrances and exits to the facility, a loading dock, transition points between regions, such as a door between the sales floor and the back room, and the like. The floor plan may additionally include contextual data defining coordinates for a layer of various interior structural features, such as shelving defining rows and columns of sales aisles on the sales floor and stock aisles in the back room. The floor plan may additionally include contextual data defining coordinates of a layer of obstructions, such as floor-to-ceiling columns or shelving, or other structural aspects (e.g., based on the architecture of the facility) that physically obstruct the placement of sensors or would inhibit the performance of the sensors if placed too close to the obstructions. Other examples of obstructions may include lighting (such as general purpose lights, spot lights, emergency lights), exit signs, speakers, merchandise, HVAC equipment (including air handlers and ductwork), conduits, plumbing, cameras, electrical equipment, network closets, and signage. The contextual data may further define a reference scale for the floor plan to define a ratio of a distance on the map (e.g., in pixels) to a real world distance (e.g., in meters) to allow appropriate spacing in the sensor layout.

In some examples, some of the above contextual data may be included in the floor plan and received with the sensor layout request. Additional contextual data, including the above examples, may be input by an operator interfacing with the floor plan, for example, via the client device 108. For example, a base floor plan may be presented at a display screen of the client device 108. The operator may annotate the floor plan to define the region type of each room and/or region. The operator may also annotate the floor plan to add or modify spatial features, internal structural features, obstructions, and various further aspects of the facility. Such annotations may then be communicated to the server 104 and stored as contextual data in association with the floor plan.

Figure 3:
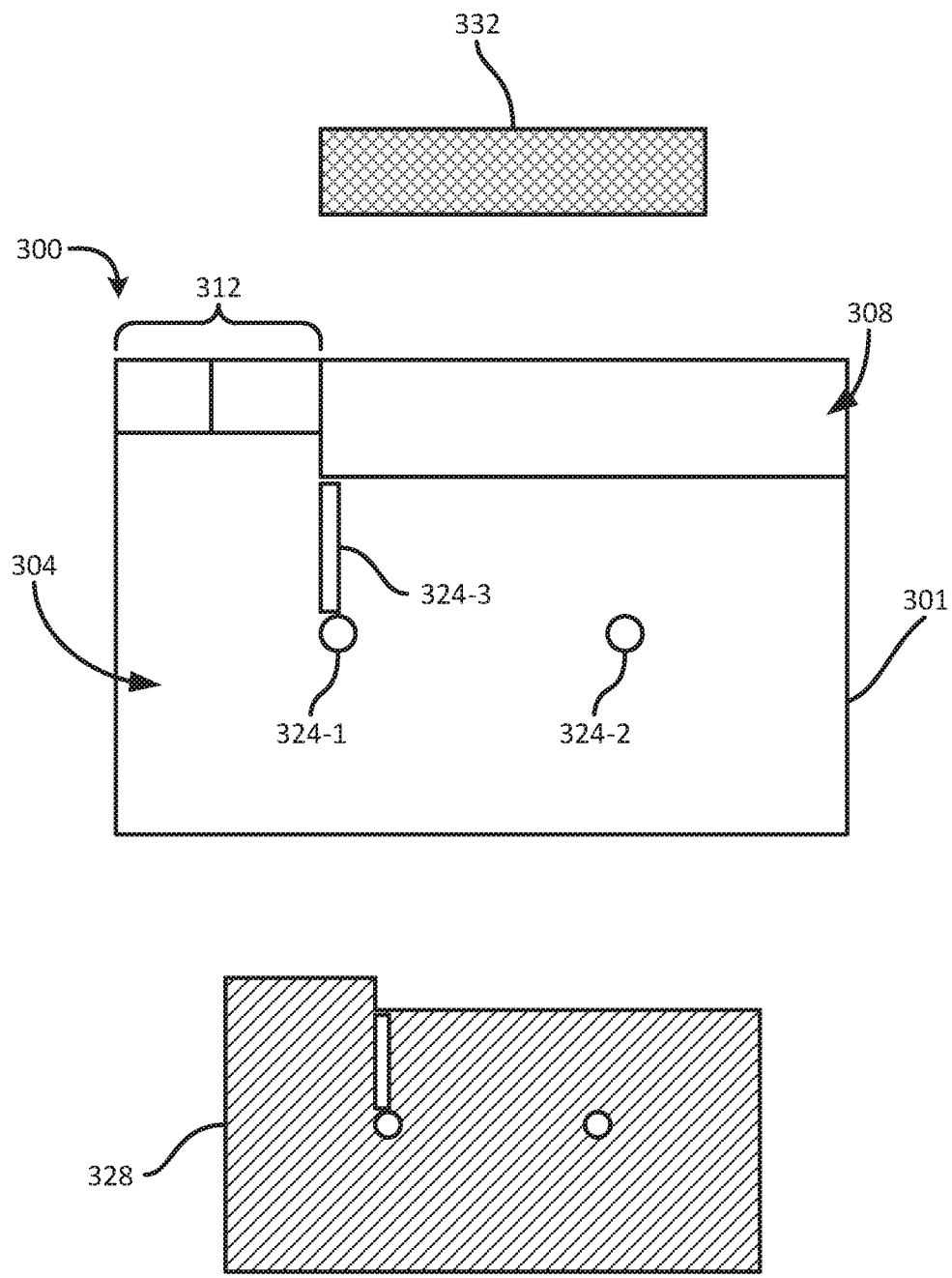
FIG. 3 is a schematic diagram of defining sensor placement regions at block 210 of the method of FIG. 2.

Referring to FIG. 3, an example retail floor plan 300 is depicted. The floor plan 300 depicts a facility 301 having four rooms. The contextual data associated with the floor plan may define the rooms as a sales floor 304, a back room 308, and a sensor-less region 312 (e.g., two bathrooms). The contextual data may further define locations of a front door and a back room door (not shown). The contextual data may further define locations of obstructions 324-1, 324-2, and 324-3 representing, for example, two structural columns and a series of floor-to-ceiling shelving units.

Returning to FIG. 2, at block 210, the server 104 defines, based on the floor plan and annotations, one or more sensor placement regions within the facility. Each sensor placement region represents a region of the floor plan in which sensors are to be placed. The sensor placement regions may typically correspond to the different rooms of the floor plan, while in other examples, the sensor placement regions may include portions of rooms, or span across multiple rooms of the floor plan.

In some examples, the sensor placement regions may be determined automatically by the server 104 based on the contextual data associated with the floor plan. For example, the server 104 may define a sensor placement region associated with each room based on the region type defined in the contextual data. As an example, the contextual data may provide enough information to identify a room as the sales floor, and hence a sensor placement region may be defined in that space, which is to be populated with merchandise sensors. The server 104 may identify the sales floor (or other region), for example, by recognizing pertinent floor plan details (e.g., specific line types that represent the walls which bound the sales floor, graphics or icons that represent sales floor merchandise shelving, or the like). In another example, the contextual data may include icons that represent checkout lanes, so the server 104 may determine a point of sale region about the icons to be a sensor placement region for the point of sale sensors to be placed. In other examples, the sensor placement regions may be determined by the server 104 in response to contextual data received from an operator at the client device 108. For example, in conjunction with the contextual data received at block 205, the operator may annotate, at an input device of the client device 108, the floor plan to mark vertices to define polygonal areas representing the different sensor placement regions of the floor plan. Additionally, the operator may annotate the floor plan to mark vertices to define polygonal areas representing obstructions. Such annotations may then be communicated to the server 104 and stored in association with the floor plan for further processing.

Specifically, the server 104 may define the sensor placement regions based on the contextual data. The sensor placement regions may be initially defined by the polygonal areas corresponding to the geometry of the rooms and/or the regions as indicated by the operator received from the client device 108. The server 104 may then subtract the polygonal areas representing obstructions and resize the resulting region, based on the reference scale, to a predefined scale to obtain the sensor placement regions.

In some examples, the sensor placement regions may also include a layer of contextual data defining interior structural features from the floor plan which are pertinent to the placement of sensors within the sensor placement region. For example, the sensor placement region may include contextual data defining the locations of shelving units forming rows and columns of sales aisles and/or back room aisles.

Referring again to FIG. 3, the sales floor 304 and the back room 308 may each correspond to their own respective sensor placement region. In particular, the sales floor 304 may correspond to a sensor placement region 328, and the back room 308 may correspond to a sensor placement region 332. Further, the sensor placement regions 328 and 332 are resized to match a predefined scale on which the sensor layout may be placed. Additionally, the sensor placement region 328 excludes the obstructions 324 so that the server 104 will generate a sensor layout which avoids placing sensors in the obstructed regions themselves or too close to the obstructed regions such that this would negatively impact the sensors' performance.

Returning again to FIG. 2, at block 215, the server 104 selects a sensor placement region from the sensor placement regions defined at block 210. That is, the server 104 may generate a sensor layout for each sensor placement region individually and iterate through the sensor placement regions to complete the sensor layout for the floor plan.

Figure 4:
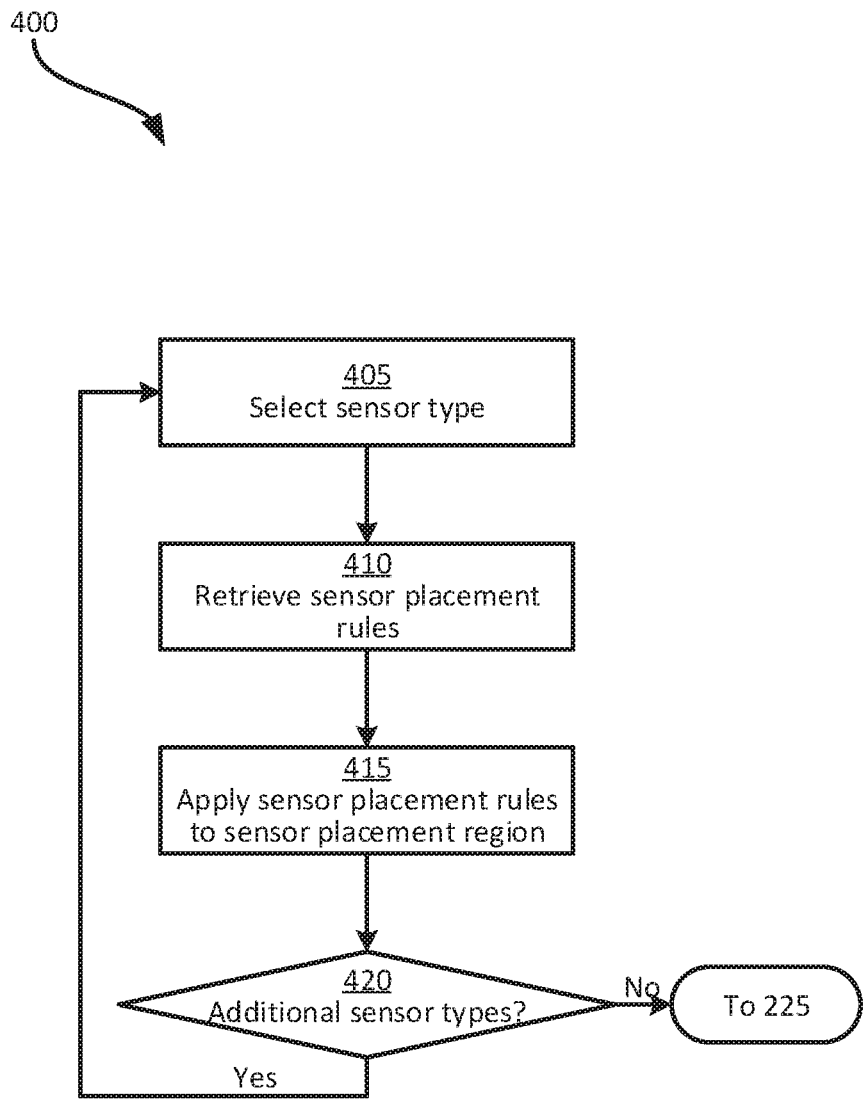
FIG. 4 is a flowchart of generating a sensor layout at block 220 of the method of FIG. 2.

At block 220, the server 104 generates a sensor layout for the sensor placement region selected at block 215. For example, referring to FIG. 4, an example method 400 of generating a sensor layout is depicted.

At block 405, the server 104 selects a sensor type based on the sensor placement region. The type of sensors to be laid out in each sensor placement region may vary based on the region type of the sensor placement region. For example, the sales floor may employ overhead merchandise sensors having a 360° detection field of view or coverage area with a sufficiently long detection range to detect merchandise tags (e.g., radio frequency identification (RFID) tags or the like) for managing and tracking merchandise on the sales floor. In contrast, the back room may employ back room sensors including a reader and multiple antennas having a substantially linear detection area to be placed along aisles of the back room for managing and tracking stock in the back room. In such examples, sensor types may be ranked by priority to enable layers of sensor layouts to be generated and logically built on each other. Thus, in some examples, the server 104 may automatically select a sensor type based on the region type of the sensor placement region. In other examples, the sensor type may be selected by an operator at the client device 108.

At block 410, the server 104 retrieves sensor placement rules from the memory 116. In particular, the server 104 may retrieve the sensor placement rules corresponding to the sensor type selected at block 405.

The sensor placement rules may include rules based on coverage specifications for the sensors, including a coverage field of view, pattern and range, how the sensors interact and cooperate with each other, and the like. For example, the sensor placement rules may include a predefined layout plan of sensors which comply with the coverage specifications, such as a predefined layout plan composed of a rectangular grid of sensors spaced at a specified distance or a predefined layout plan composed of another shape grid with defined sensor-to-sensor dimensions, as well as rules for applying the predefined layout plan to the sensor placement region to optimize coverage and minimize cost in the sensor placement region. For example, the predefined layout plan may be applied to the sensor placement region as a whole, or to particular features of the sensor placement region, as defined by the contextual data. The sensor placement rules may further include rules defining how to handle exceptions to alter the predefined layout plan, such as handling obstructed regions, sensors in the sensor layout proximate edges of the sensor placement regions, and the like. The sensor placement rules may therefore further include threshold tolerances for adjusting the sensors in the predefined layout plan to maintain the coverage specifications.

For example, merchandise sensors may provide robust coverage for a 360° field of view with up to about a 30 foot radius. The placement rules for merchandise sensors may therefore specify a 40 foot square grid. A merchandise sensor is placed at every grid intersection, or corner of a square, and is therefore 40 feet from the next sensor. Each merchandise sensor therefore covers more than half the distance along the edges of the respective 40 foot squares, specifically at least about 20 feet. The distance to the center of each 40 foot square from its respective corners, where the sensors are placed, is about 28 feet, which is less than the about 30 foot radius of coverage each sensor provides. Thus placing the merchandise sensors on a 40 foot grid provides good overlapping sensor coverage. The predefined layout plan for merchandise sensors may therefore be a 40 foot square grid.

Back room sensors may be connected to the system using cables that are about 17 feet long. In particular, longer cables create too much loss and negatively affect the performance of the sensors. This coverage limitation may provide the basis for back room sensor placement rules. In order to reduce the number of back room sensors while increasing coverage and performance, the sensor-to-sensor linear coverage may be about 29 feet (e.g., 2×17 feet, accounting for 5 feet of cable routing and slack). The predefined layout plan for back room sensors may therefore be along a line, spaced every 29 feet, and centered in the aisle.

At block 415, the sensor placement rules retrieved at block 410 are applied to the sensor placement region. In particular, the predefined layout plan may be applied to the sensor placement region and adjusted within the constraints of the sensor placement rules to optimize coverage while minimizing cost, as well as to handle obstructed regions and sensor placement region edges. Sensors within the predefined layout plan may be individually shifted to comply with sensor placement conditions for specific spatial features, such as the perimeter of the sensor placement region, corners of regions, entrances/exits, transition points, or the like. For example, sensors may be shifted to avoid obstructed regions which were removed from the sensor placement regions. In some examples, the sensors may also be adjusted based on interior structural features of the sensor placement regions, such as to align with aisles or the like. In some examples, shifting of individual sensors may be limited by a threshold tolerance. For example, sensors shifted to accommodate obstructions may be limited by a threshold tolerance to ensure that coverage is not compromised. If that threshold distance is exceeded, the server 104 may add an additional sensor in the appropriate location to ensure adequate and optimized coverage.

Figure 5A:
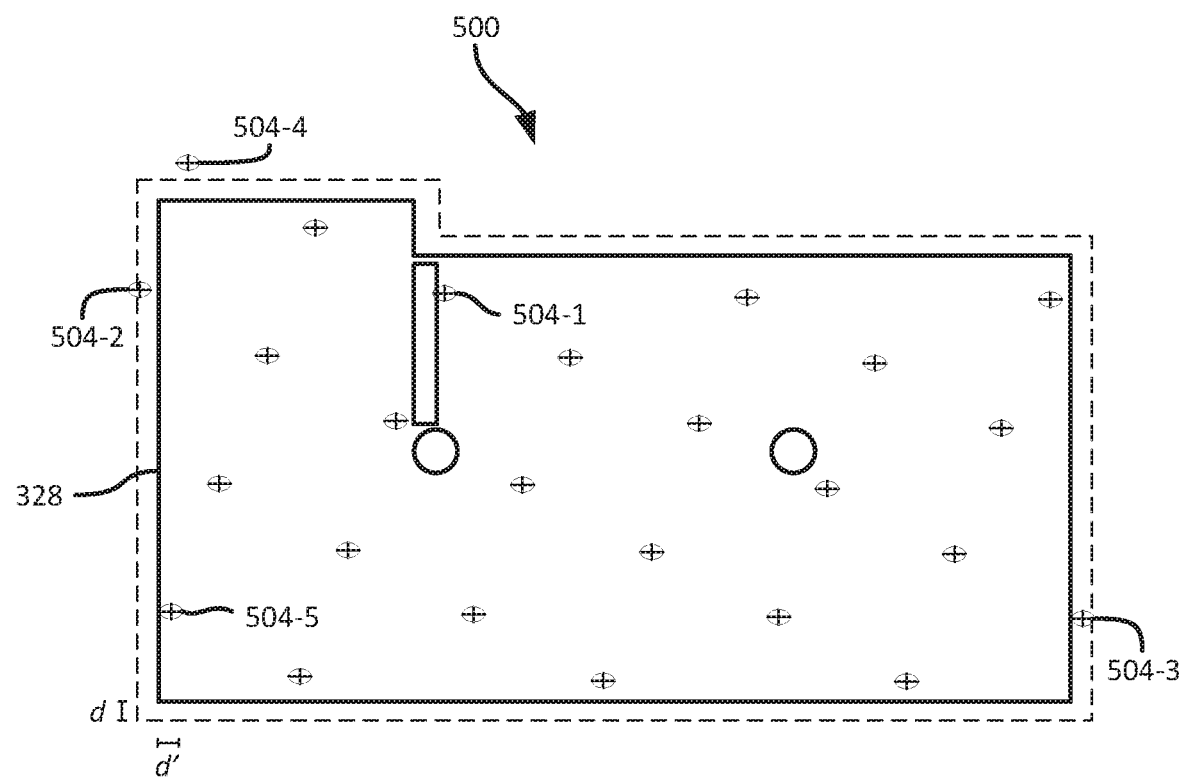
FIGS. 5A and 5B are schematic diagrams of a sensor layout generated during execution of the method of FIG. 4.
Figure 5B:
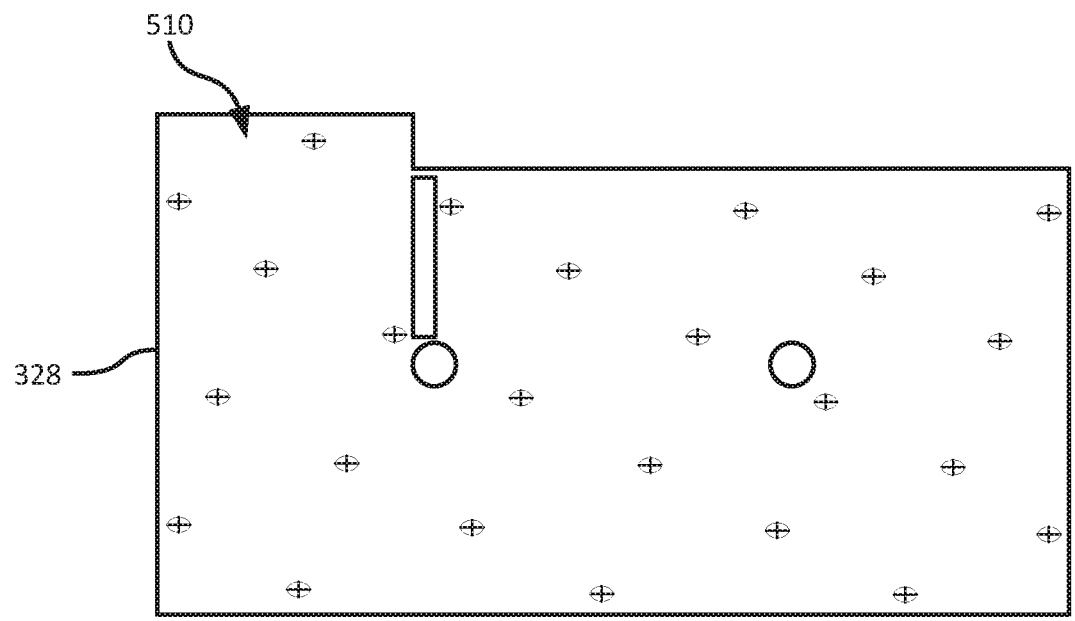

For example, referring to FIGS. 5A and 5B, a schematic of the application of the method 400 to generate a sensor layout for the sensor placement region 328 is depicted. First, at block 405, the server 104 selects a sensor type based on rules stored in the memory 116. As the sensor placement region 328 corresponds to the sales floor 304, the appropriate sensor type may be a merchandise sensor. At block 410, the server 104 retrieves the sensor placement rules for merchandise sensors. In particular, the sensor placement rules may include a predefined layout plan 500 for the merchandise sensors. For example, the predefined layout plan 500 for the merchandise sensors may be a rotated or reverse rotated (e.g., by about 27°, or another suitable angle, as determined based on the coverage specifications of the sensors) affine transformation of a geometric grid layout to optimize sensor coverage. The sensor placement rules may also include handling rules for the perimeter of the sensor placement region 328.

At block 415, the server 104 applies the predefined layout plan 500 to the sensor placement region 328. Individual sensors, such as sensor 504-1 may be shifted to be contained entirely within the sensor placement region 328 so as to avoid the obstruction 324-3. Additionally, sensors 504-2 and 504-3 defined in the predefined layout plan 500 which are within a threshold distance d external to the perimeter of the sensor placement region 328 may be moved inside the sensor placement region 328. For example, the sensors 504-2 and 504-3 may be moved to the nearest point within the sensor placement region 328, aligned with a nearest aisle or other interior structural feature of the sensor placement region, to a point furthest from existing sensors within the sensor placement region, or the like. In contrast, sensor 504-4 of the predefined layout plan 500 which is more than the distance d external to the perimeter of the sensor placement region 328 is discarded. In further examples, sensor 504-5 defined in the predefined layout plan 500 which is within a threshold distance d' internal to the perimeter of the sensor placement region 328 may also be adjusted, for example, to align with a nearest aisle or other interior structural feature of the sensor placement region. For example, the sensor 504-5 may be moved inwards, away from the wall and aligned, for example, with a nearby shelving unit. Additionally, the server 104 may make the above individual adjustments within the threshold tolerance for merchandise sensors to maintain the coverage specifications. Functional coverage is not over- or under-compensated while keeping adjacent sensors at appropriate distances.

Accordingly, after applying the sensor placement rules to the sensor placement region 328, the server 104 may generate an automated sensor layout 510, as depicted in FIG. 5B.

Returning to FIG. 4, at block 420, the server 104 determines whether there are other sensor types to place within the sensor placement region. If the determination at block 420 is negative, the server 104 returns to block 225 of the method 200. If the determination at block 420 is affirmative, the server 104 returns to block 405 to select the next sensor type and continue laying out sensors in the sensor placement region.

Figure 6A:
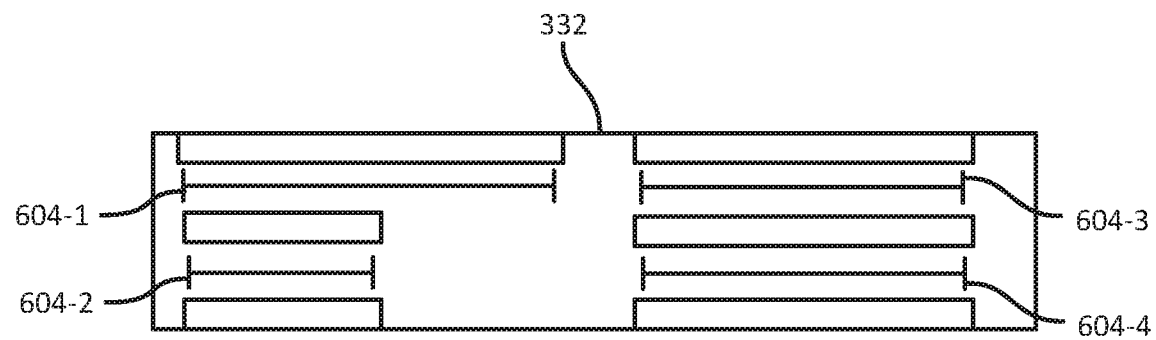
FIGS. 6A, 6B, and 6C are schematic diagrams of another sensor layout generated during execution of the method of FIG. 4.
Figure 6B:
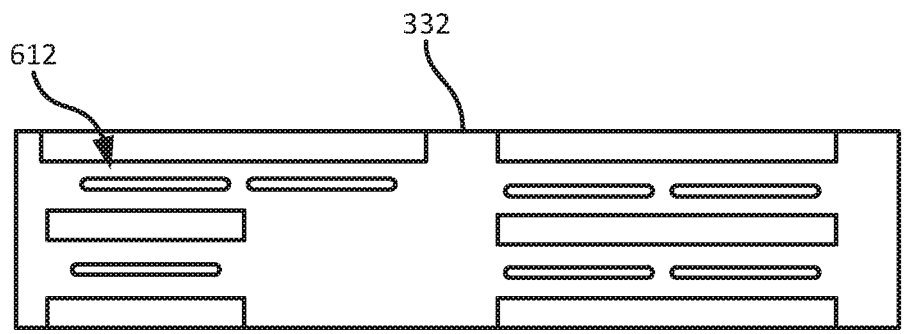
Figure 6C:
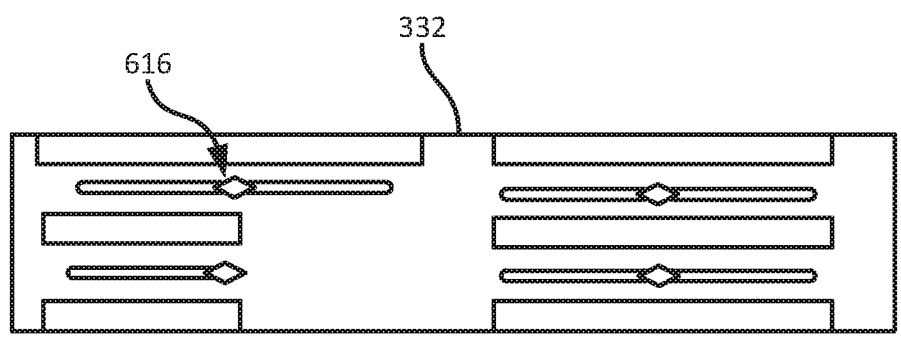

For example, referring to FIGS. 6A, 6B, and 6C, a schematic of the application of the method 400 to generate a sensor layout for the sensor placement region 332 is depicted. In particular, as the sensor placement region 332 corresponds to the back room 308, two sensor types may be employed—back room antennas, whose coverage spans down aisles for a specified distance, and back room readers, which may include multiple ports to connect to one or more back room antennas. That is, the sensor layout for the sensor placement region 332 includes multiple sensor types, and hence iterates through the method 400 multiple times.

In a first iteration of the method 400, the server 104 selects back room antenna sensor types and applies the predefined layout plan for the antennas to the back room sensor placement region 332. In particular, the predefined layout plan for antennas is applied to each aisle identified by rows or columns of shelving units. Accordingly, the server 104 may first use the contextual data associated with the sensor placement region 332 to locate shelving units, and extrapolate locations for aisles 604-1, 604-2, 604-3, and 604-4. The server 104 may then apply the predefined layout plan for antennas to each aisle 604 to generate a first sensor layout 612. In particular, the predefined layout plan may begin at or near a left (or upper) coordinate of the aisle, with any extraneous antenna sensors beginning past the end of the aisle being discarded. The predefined layout plan may also include an optimal distance, with tolerance, from antenna sensor to antenna sensor along the aisle.

In a second iteration of the method 400, the server 104 selects back room reader sensor types and applies the predefined layout plan for the reader sensors to the back room sensor placement region 332. In particular, the predefined layout plan for reader sensors is applied to sensor layouts of antennas applied along aisles so that each antenna is connected to one reader, and so that antennas share readers where possible. The server 104 may give priority to positioning back room reader sensors to maximize the number of back room antennas being connected to and associated with back room readers located in the same aisle. Additionally, up to four back room antennas may be connected to each back room reader while not exceeding a specified distance from the reader to each antenna to minimize the number of back room readers and maintain the appropriate proximity of one sensor type to another. That is, in the present example, the server 104 applies the predefined layout plan to the first sensor layout 612 to generate a second sensor layout 616.

Returning to FIG. 2, at block 225, server 104 generates a list of sensor devices and corresponding coordinates for the sensor devices. The coordinates for the sensor devices are generated by comparing the sensor layout within the sensor placement region to the floor plan and providing the coordinates within the coordinate system of the floor plan.

Figure 7:
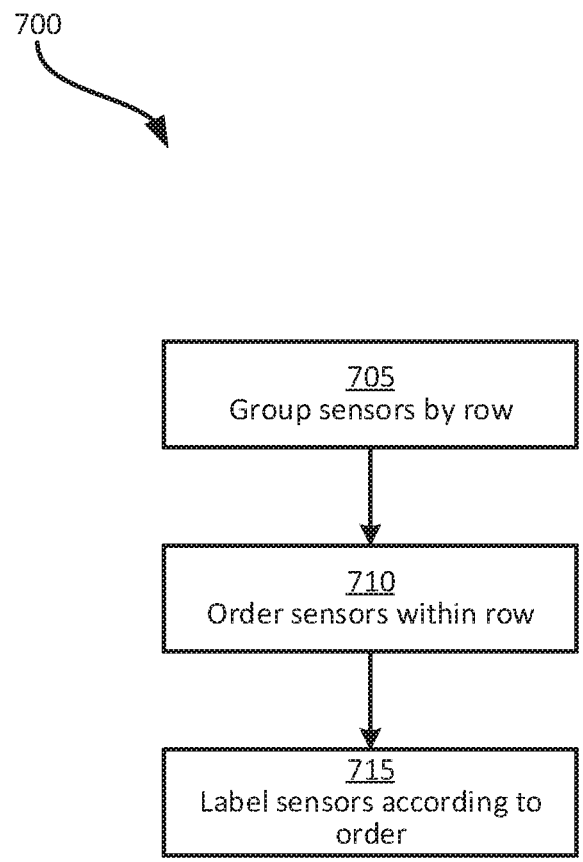
FIG. 7 is a flowchart of a method of labelling sensors at block 230 of the method of FIG. 2.

In some examples, at block 225, the server 104 may also label the sensor devices. For example, referring to FIG. 7, an example method 700 of labelling sensors is depicted.

At block 705, the server 104 groups the sensor devices according to row. That is, the server 104 compares the coordinates of the sensor devices and groups sensor devices having y-coordinates within a threshold distance of each other.

At block 710, the server 104 loops through the sensors in each row and orders them such that a path drawn sequentially from sensor to sensor would correspond to a natural and efficiently winding walking path. This pattern makes it easier to physically locate each sensor after they are all installed. For example, when an operator walking through the facility following the sensors sequentially gets to the end of a row, the operator may simply turn around and find the next sequentially ordered sensor nearby rather than returning across the full width of the facility to get to the next sequentially ordered sensor. In particular, the server 104 compares the coordinates of the sensor devices and orders them according to their x-coordinates. Further, in order to create a natural walking path, the server 104 may consider the previously ordered row and alternate between beginning ordering the sensor devices having the left-most and right-most x-coordinate in each row. The path generated therefore travels from left to right, then right to left, and continues in this alternating fashion, allowing personnel to easily locate each device one-by-one as they walk through the facility.

Figure 8A:
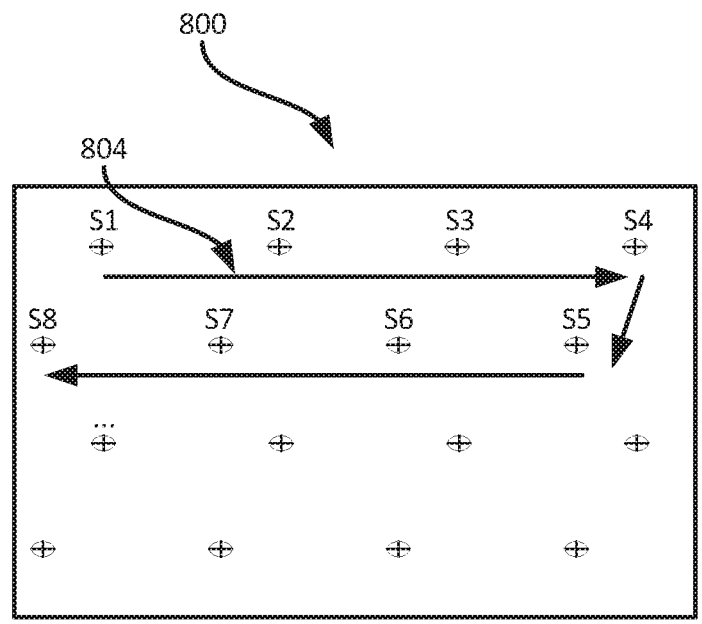
FIGS. 8A and 8B are schematic diagrams of labels applied to sensor layouts during the method of FIG. 7.

For example, referring to FIG. 8A, an example sensor layout 800 is depicted. The sensors Si through S4, which share a row, are labelled to create a path 804 from left to right. S5 through S8, which share the next row, are labelled from right to left so that, after S4, the path 804 is extended down to the row of S5 through S8, and across said row to correspond to a natural and efficient walking path.

Returning to FIG. 7, at block 715, the server 104 labels the sensors according to the order determined at blocks 705 and 710. In some examples, the sensors may be grouped by sensor type, by floor, or other suitable groupings prior to labelling. For example, merchandise sensors may first be grouped, and then within that group, further grouped by row. This grouping process may be repeated for the next sensor type. This allows for a sensor layout to have sequential labels within each sensor type. For example, if a point of sale sensor is in the middle of the same row as merchandise sensors, the point of sale sensor's label number will not disrupt the ordering of the merchandise sensors. Rather, each type of sensor may have its own defined, regular numbering sequence. Further, the labels may include segments to represent such parameters.

For example, if a point of sale sensor is in the middle of the same row as merchandise sensors, sensors may be labelled M21, M22, P1, M23, M24. Thus the merchandise sensors, labelled with the segment "M" to represent the sensor type, are ordered in a continuous fashion. Similarly, the point of sale sensor, labelled with the segment "P" to represent the sensor type, is labelled independently of the merchandise sensors, as they are grouped separately by sensor type.

In some examples, the method 700 may be re-run after a manual sensor addition or subtraction or adjustment of a sensor device, such as its location or type, to maintain the alignment of the natural walking path with the sequential sensor labelling. In particular, the server 104 may first determine whether the sensor layout has been implemented via physical installation. If it has not, then the method 700 is re-run, to keep the labelling scheme simple and practical. If the sensor layout has been implemented, the server 104 may not re-run the method 700 and may instead simply increment to the next available label in the sequence, such as the next number, for a newly added sensor device. For a newly subtracted or adjusted sensor device after the sensor layout has been implemented, the server 104 may make no change to the labelling. In such case, the layout's label rearrangement that would have been caused by re-running the method 700 would have cascaded to sensor labels subsequent to the newly added, subtracted, or adjusted sensors. With the sensors already physically installed, this rearrangement would cause a time-consuming, costly, and potentially confusing physical update to the installation.

Figure 8B:
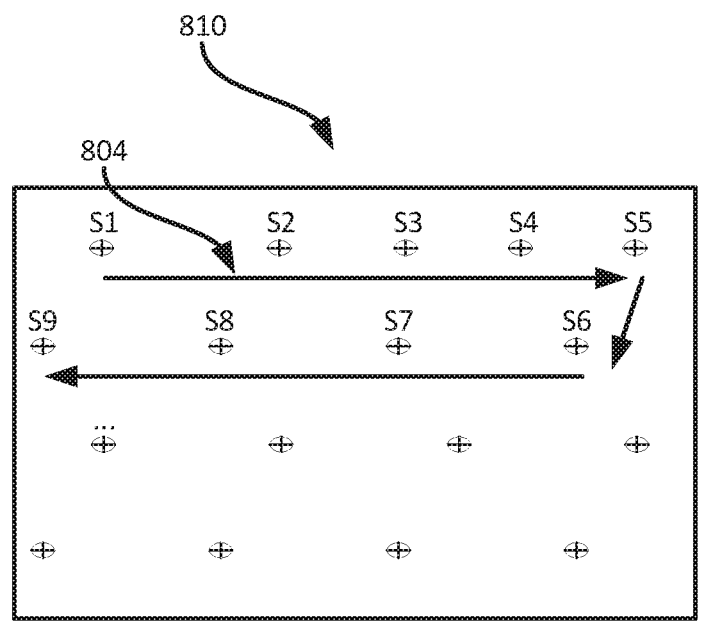

For example, referring to FIG. 8B, an example sensor layout 810 is depicted, after a new sensor has been manually added to the first row and the sensor S3 has been shifted to accommodate the new sensor. For example, certain structural features may prompt additional sensor coverage. If the sensor layout has not been physically installed, the method 700 may be re-run. The sensors in the first row are re-labelled 51 through S5, and the sensors in the second row, while their positions have not changed, are re-labelled S6 through S9. The path 804 which corresponds to a natural and efficient walking path is maintained.

Returning again to FIG. 2, at block 230, the server 104 outputs the list of sensor devices and the corresponding coordinates. The list may include the sensor label, the sensor type, the coordinates for the sensor, and other pertinent information. The list may be output, for example, to the client device 108 for display at the client device 108, stored in the memory 116 for further processing, or the like.

At block 235, if there are additional sensor placement regions for which sensor layouts have not yet been generated, the server 104 returns to block 215. If there are no additional sensor placement regions, the method 200 ends.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A computing device comprising:
   a memory storing sensor placement rules;
   a processor connected with the memory, the processor configured to:
      obtain a floor plan representing a facility, the floor plan including contextual data representing spatial and structural features of the facility;
      define, based on the contextual data of the floor plan, one or more sensor placement regions within the facility indicative of at least one region of the floor plan in which at least one sensor device is to be placed;
      for each sensor placement region:
         generate a sensor layout within the sensor placement region based on the sensor placement rules;
         generate, based on a correspondence between the sensor placement region and the floor plan, a list of sensor devices and corresponding coordinates for each sensor device to be placed;
         output the list of sensor devices and the corresponding coordinates; and label each sensor device based on respective coordinates of each sensor device, wherein, to label each sensor device, the processor is configured to:
         group the sensor devices according to row;
         determine an order for the sensor devices in each row;
         group the sensor devices according to sensor type; and
         label the sensors based on the sensor type and the determined order.

2. The computing device of claim 1, wherein, to define each of the one or more sensor placement regions, the processor is configured to:
define a polygonal area corresponding to a geometry of a region of the floor plan;
subtract, from the polygonal area, further polygonal areas representing obstructions, the further polygonal areas defined in the contextual data.

3. The computing device of claim 1, wherein, prior to generating the sensor layout for the sensor placement regions, the processor is further configured to resize the sensor placement regions according to a reference scale of the floor plan defined in the contextual data.

4. The computing device of claim 1, wherein, to generate the sensor layout, the processor is configured to:
select a sensor type for the sensor placement region;
retrieve the sensor placement rules corresponding to the sensor type; and
apply the sensor placement rules to the sensor placement region.

5. The computing device of claim 4, wherein, to apply the sensor placement rules to the sensor placement region, the processor is configured to apply a predefined layout plan to the sensor placement region.

6. The computing device of claim 5, wherein the processor is further configured to shift individual sensors in the predefined layout plan to comply with sensor placement conditions for the spatial features of the facility.

7. The computing device of claim 6, wherein the processor is configured to limit shifting the individual sensors by a threshold tolerance.

8. The computing device of claim 1, wherein to generate the sensor layout, the processor is configured to:
generate a first sensor layout for a first type of sensor; and
generate a second sensor layout for a second type of sensor, the second sensor layout based on the first sensor layout.

9. The computing device of claim 1, wherein a path drawn sequentially based on the labelled sensor devices corresponds to a naturally winding walking path.

10. The computing device of claim 1, wherein the processor is further configured to, in response to an addition of a new sensor device or a subtraction or an adjustment of one of the sensor devices, re-label each sensor device based on the respective coordinates of each sensor device.

11. A method comprising:
storing, at a memory, sensor placement rules;
obtaining a floor plan representing a facility, the floor plan including contextual data representing spatial and structural features of the facility;
defining, based on the contextual data of the floor plan, one or more sensor placement regions within the facility indicative of at least one region of the floor plan in which at least one sensor device is to be placed;
for each sensor placement region:
generating a sensor layout within the sensor placement region based on the sensor placement rules;
generating, based on a correspondence between the sensor placement region and the floor plan, a list of sensor devices and corresponding coordinates for each sensor device to be placed;
outputting the list of sensor devices and the corresponding coordinates; and
labelling each sensor device based on respective coordinates of each sensor device, wherein labelling each sensor device, comprises:
grouping the sensor devices according to row;
determining an order for the sensor devices in each row;
grouping the sensor devices according to sensor type; and
labelling the sensors based on the sensor type and the determined order.

12. The method of claim 11, wherein defining each of the one or more sensor placement regions comprises:
defining a polygonal area corresponding to a geometry of a region of the floor plan;
subtracting, from the polygonal area, further polygonal areas representing obstructions, the further polygonal areas defined in the contextual data.

13. The method of claim 11, further comprising resizing the sensor placement regions according to a reference scale of the floor plan defined in the contextual data.

14. The method of claim 11, wherein generating the sensor layout comprises:
selecting a sensor type for the sensor placement region;
retrieving the sensor placement rules corresponding to the sensor type; and
applying the sensor placement rules to the sensor placement region.

15. The method of claim 14, wherein applying the sensor placement rules to the sensor placement region comprises applying a predefined layout plan to the sensor placement region.

16. The method of claim 15, wherein applying the sensor placement rules to the sensor placement region further comprises shifting individual sensors in the predefined layout plan to comply with sensor placement conditions for the spatial features of the facility.

17. The method of claim 16, wherein the shifting the individual sensors is limited by a threshold tolerance.

18. The method of claim 11, wherein generating the sensor layout comprises:
generating a first sensor layout for a first type of sensor; and
generating a second sensor layout for a second type of sensor, the second sensor layout based on the first sensor layout.

19. The method of claim 11, wherein a path drawn sequentially based on the labelled sensor devices corresponds to a naturally winding walking path.

20. The method of claim 11, further comprising, in response to an addition of a new sensor device or a subtraction or an adjustment of one of the sensor devices, re-labelling each sensor device based on the respective coordinates of each sensor device.

* * * * *